United States Patent [19]

McGann et al.

[11] Patent Number: 5,185,588
[45] Date of Patent: Feb. 9, 1993

[54] FREQUENCY SELECTIVE LIMITER WITH FLAT LIMITING RESPONSE

[75] Inventors: William E. McGann, Linthicum; Thomas E. Steigerwald, Columbia, both of Md.; John D. Adam, Murrysville, Pa.

[73] Assignee: Westinghouse Electric Corp., Pittsburgh, Pa.

[21] Appl. No.: 658,498

[22] Filed: Feb. 21, 1991

[51] Int. Cl.⁵ .................. H03G 11/00; H01P 1/32; H01P 1/36
[52] U.S. Cl. .................. 333/17.2; 333/24.1; 333/24.2; 333/81 A
[58] Field of Search .......... 333/17.2, 24.1, 24.2, 333/81 A

[56] References Cited

U.S. PATENT DOCUMENTS

| | | | |
|---|---|---|---|
| 4,845,439 | 7/1989 | Stitzer et al. | 333/17.2 |
| 4,980,657 | 12/1990 | Stitzer et al. | 333/17.2 |
| 5,023,573 | 6/1991 | Adam | 333/17.2 |

FOREIGN PATENT DOCUMENTS

| | | | |
|---|---|---|---|
| 290353 | 11/1971 | U.S.S.R. | 333/17.2 |

Primary Examiner—Eugene R. LaRoche
Assistant Examiner—Michael B. Shingleton
Attorney, Agent, or Firm—D. E. Maire

[57] ABSTRACT

The invention is directed to an FSL in which a pair of planar ferrite members have planar surfaces in confronting relationship and at least one signal carrying conductor is supported between the ferrites and is closely coupled thereto. A magnetic biasing field is established having field lines disposed at an angle relative to the conductor such that the FSL has an increased attenuation at low frequencies resulting in a relatively flat limiting characteristic across the bandwidth. The conductor may lie in a plane parallel to the field lines or transverse to the field lines. In one embodiment the conductor zigzags in the plane of the field.

13 Claims, 2 Drawing Sheets

FREQUENCY SELECTIVE LIMITER WITH FLAT LIMITING RESPONSE

BACKGROUND OF THE INVENTION

1. Field of the Invention:

The invention relates to frequency selective limiters (FSLs) and in particular to an FSL having an improved limiting response over its bandwidth.

2. Description of the Prior Art

FIG. 1 illustrates a typical configuration of a known FSL 10. A planar YIG substrate 12 carries a conductor 14 in a known manner. The YIG 12 and conductor 14 are aligned along an axis 16. Biasing magnets 18 having opposed pole pieces 20 provide a magnetic field H. The conductor 14 is parallel to the poles 20 and lies perpendicular to the field H.

It should be understood that the field H may be rotated 90° about the axis 16. This may be accomplished by repositionment of the magnets 18 and pole pieces 20 to the positions shown in phantom. In either case the magnetic field H is perpendicular to the conductor 14 along the axis 16.

Known FSLs have a frequency dependent response to incoming signals as illustrated by curve 22 in FIG. 2. The bandwidth is about 3 GHz with a low frequency at about 2.4 GHz and the high frequency at about 5.4 GHz. Although the actual values vary within the bandwidth, in general the attenuation versus frequency response of the upper two-thirds of the curve 22 is generally flat and the lower one-third rolls off at low frequencies. Thus, attenuation of the low frequency signals is reduced and it becomes more difficult to distinguish low power signals of interest in the presence of high power signals at the low frequency end of the bandwidth. Ideally the curve 22 should be flat across the bandwidth including the low frequency end as illustrated by the dotted line 24.

Low frequency roll off is undesirable because it leaves a zone of vulnerability. While it may be possible to increase low frequency sensitivity, such an increase is achieved at the cost of adding additional FSL stages to those already in use which increases the delay between the detection of a signal and the processing of a signal. When the delay time is increased to unacceptable levels, the system cannot respond quickly enough to process the incoming information and allow for appropriate countermeasures. Also, additional FSL stages undesirably add to the cost and weight of the FSL and reduce volume efficiency.

SUMMARY OF THE INVENTION

The present invention improves the performance of described prior frequency selective limiter (FSL) arrangements. In particular, the present invention results in a relatively flat attenuation characteristic over the bandwidth of the FSL.

In a particular embodiment, the invention is directed to an FSL for selectively attenuating signals within a given bandwidth and above a selected threshold and allowing signals below the threshold to pass without significant attenuation. A pair of planar ferrite members have planar surfaces in confronting relationship and at least one signal carrying conductor is supported between the ferrites and is closely coupled thereto. Means is provided for establishing a magnetic field having field lines disposed at an angle relative to the conductor such that the FSL has an increased attenuation at low frequencies resulting in a relatively flat limiting characteristic across the bandwidth. Depending upon whether the magnetic field lines are parallel to the plane of the FSL or lie at an angle transversely to the plane of the FSL, the angle of the conductor with respect to the field lines is about between 10° and 20°. In another embodiment a zigzag stripline lying in the plane of the field is employed. The angle of the zigzag is between about 10°–30°.

DESCRIPTION OF THE PREFERRED EMBODIMENT

Figure 1:
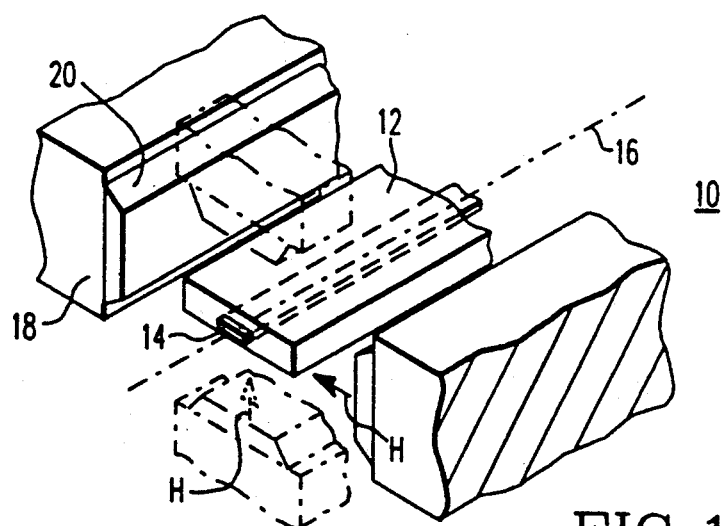
FIG. 1 is a fragmentary perspective illustration of a known FSL with an alternative embodiment illustrated in phantom lines.
Figure 2:
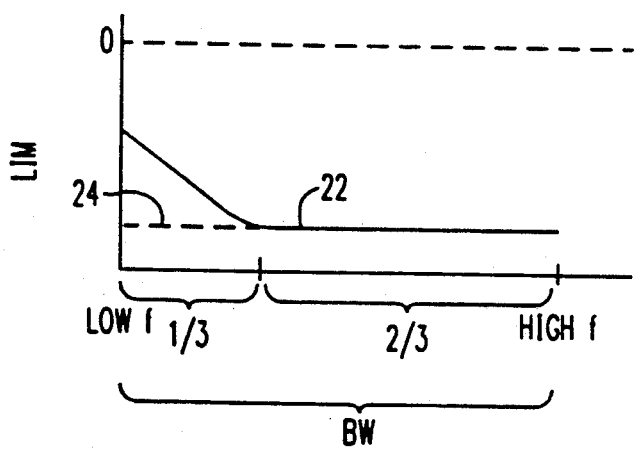
FIG. 2 is a curve representing attenuation versus frequency of the FSL of FIG. 1 with an ideal response illustrated in dotted line.
Figure 3:
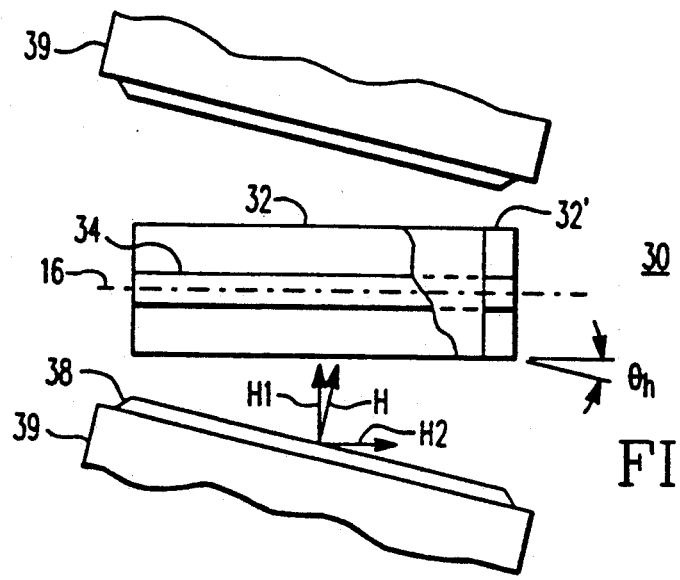
FIG. 3 is a plan view of an FSL according to the present invention.

FIG. 3 illustrates a frequency selective limiter according to one embodiment of the present invention in which a pair of YIG films 32, 32' are arranged in a known manner. At least one conductor 34 is located between the YIG films 32, 32, The YIG films 32, 32' and the conductor 34 lie in the plane of the conductor axis 16. The pole pieces 38 of the magnets 39 establish a magnetic field H therebetween. The magnetic field H is tilted in the horizontal plane and lies at an angle $O_h$ with respect to the axis 16 of the conductor 34, thereby resulting in field components H1 and H2. H1 is normal to the YIG film and H2 is parallel to the YIG film 32 as shown. It has been found that by adjustment of the angle $O_h$ a relatively flat limiting characteristic can be achieved over the entire bandwidth of FIG. 2 including the lower frequency region 24 as illustrated by the dotted line 24. In the embodiment illustrated in FIG. 3, the angle $O_h$ may vary from about 10° to 20°. Preferably the angle is about 13°.

Figure 4:
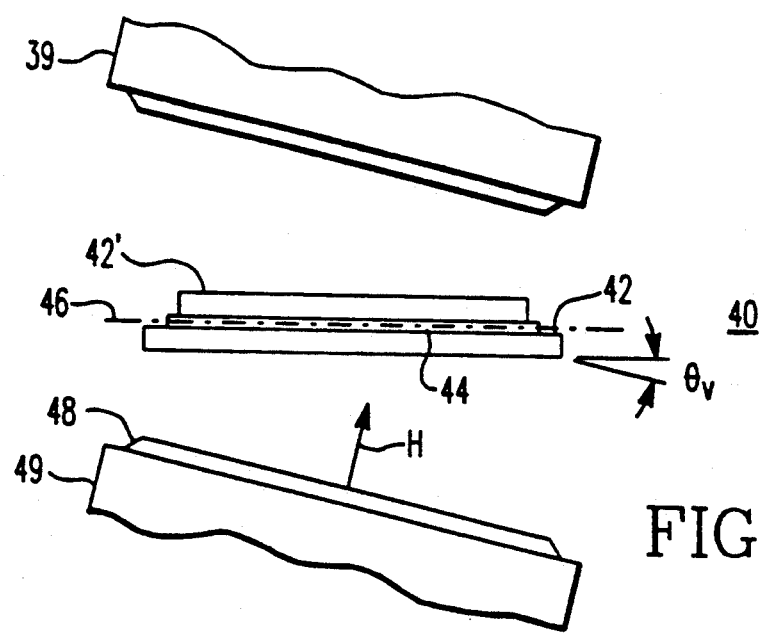
FIG. 4 is a side view of an alternative embodiment of the FSL according to the present invention.

FIG. 4 illustrates an FSL 40 according to another embodiment of the invention in which the lower YIG film 42 contains at least one current carrying conductor 44. Upper YIG film 42' lies atop and is bonded to the conductor 44 and lower YIG film 42 in a known manner. The FSL 40 lies in a vertical plane perpendicular to the plane of the drawing. The YIG film 42 and the conductor 44 lie along an axis 46 which is in the plane of the paper. The pole pieces 48 and magnets 49 produce a magnetic field H also in the plane of the paper which is tilted an angle $O_v$ with respect to the film 42 and conductor 44.

It has been found that the angle $O_v$ may be varied from between about 10° and 20°. In particular, good results are obtained when the angle $O_v$ is about 13°.

FIGS. 3 and 4 illustrate methods and apparatus for improving the frequency limiting characteristic of the FSLs according to present invention by physically orienting the YIG film and conductors at an angle with respect to the applied bias field. The arrangements illustrated necessarily require more physical space than arrangements in which the YIG film, conductor and magnets are in parallel alignment. In either case, if desired, multiline arrangements may be employed to conserve volume and weight.

Figure 5:
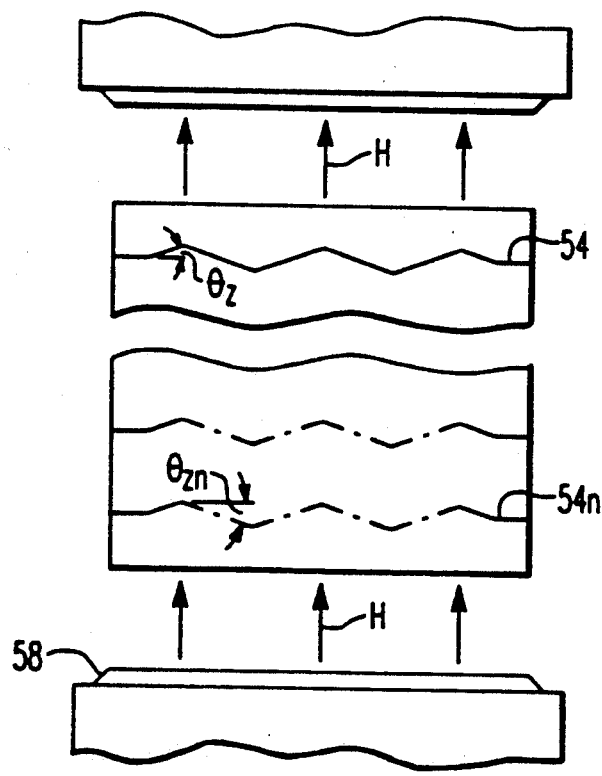
FIG. 5 is another alternative embodiment of the invention showing in fragmentary form an arrangement employing one or more zigzag conductors lying on a substrate in a plane parallel to the field.

In accordance with another embodiment of the invention, a FSL 50 is illustrated in FIG. 5. In the arrangement, YIG film 52 carries at least one conductor 54. The conductor 54 is in the form of a zigzag stripline on the surface of the YIG film 52. The upper YIG film is not shown. The angle $O_x$ that the conductor 54 makes with respect to the field H determines the attenuation characteristic for that particular conductor. By providing multiple angular passes or a zigzag pattern, the space between the poles 58 is relatively unaltered from conventional arrangements except that the angular displacement of the conductor 54 results in a flat limiting characteristic. In the arrangement of FIG. 5, the angle $O_z$ may vary between about 10° and 30°. Flat limiting has been achieved with a zigzag angle of about 19°.

The conductor 54 could be arranged without a zigzag pattern and lie simply at an appropriate angle with respect to the field H. However, this would require a wider spacing of the poles 58 and may be undesirable in terms of volume efficiency. Also, multiline arrangements are possible if desired. In FIG. 5, one or more lines 54n having a corresponding zigzag angle $O_{zn}$ may be employed if desired. Such an arrangement would be more compact than a single conductor arrangement and would have a corresponding of greater volume efficiency.

It has been found that by employing the techniques according to the present invention, the limiting characteristics of FSLs produced thereby are improved by at least of a power ratio 2:1 in the lower third of the bandwidth. More importantly, because the limiting characteristic is flattened, the relative difference between high power signals to be attenuated and the lower power signals to be distinguished converge more readily within the maximum delay times presently envisioned.

While there has been described what at present are believed to be the preferred embodiments of the present invention, it will be apparent to those skilled in the art the various changes and modifications may be made therein without departing from the invention, and is intended in the appended claims to cover all such modifications and changes that come within true spirit and scope of the invention.

What is claimed is:

1. A frequency selective limiter comprising:
    a pair of planar ferrite members having planar surfaces in confronting relationship;
    at least one signal carrying conductor supported between the ferrites and being closely coupled thereto; and
    means for establishing a magnetic field having field lines disposed at a non-orthogonal angle relative to the conductor.

2. A frequency selective limiter according to claim 1 wherein the field lines are in a plane parallel to the plane of the ferrite.

3. The frequency selective limiter according to claim 2 wherein the angle is between about 10° and 20°.

4. The frequency selective limiter according to claim 3 wherein the angle is about 13°.

5. The frequency selective limiter according to claim 1 wherein the field lines are in a plane orthogonal to the ferrite.

6. The frequency selective limiter of claim 5 wherein the angle is between about 10° to 20°.

7. The frequency selective limiter of claim 6 wherein the angle is about 13°.

8. The frequency selective limiter according to claim 1 wherein the conductor is in the form of a zigzag strip line on the ferrite.

9. The frequency selective limiter according to claim 8 wherein the angle of the conductor with respect to the field lines is about between 10° and 30°.

10. The frequency selective limiter according to claim 9 therein the angle is about 19°.

11. The frequency selective limiter according to claim 1 wherein the conductor comprises a plurality of conductors on the ferrite.

12. A frequency selective limiter for selectively attenuating signals within a bandwidth above a threshold and allowing signals below the threshold to pass without significant attenuation comprising:
    a pair of planar ferrite members having planar surfaces in confronting relationship;
    means for establishing a magnetic field parallel to the ferrite members; and
    a plurality of signal carrying conductors in the form of zigzag striplines supported between the ferrites and being closely coupled thereto; said zigzag striplines disposed at a non-orthogonal angle relative to the magnetic field essentially flat limiting characteristic across the bandwidth.

13. A frequency selective limiter comprising at least one signal carrying conductor; a ferrite member in closely coupled relationship with the conductor; and means for establishing a biasing magnetic field with respect to the conductor and the ferrite wherein field lines produced by the biasing means lie at a non-orthogonal angle with respect to the conductor such that the limiter has an essentially flat limiting characteristic across its bandwidth.

* * * * *